United States Patent
Hohmann

(10) Patent No.: US 6,842,094 B2
(45) Date of Patent: Jan. 11, 2005

(54) ELECTRONIC COMPONENT CONTAINING CAPACITANCE DIODES, HAVING DIFFERENT CAPACITANCE RANGES, AND CIRCUIT CONFIGURATION CONTAINING THE COMPONENT

(75) Inventor: Henning Hohmann, München (DE)

(73) Assignee: Infineon Technologies AG, Munich (DE)

(*) Notice: Subject to any disclaimer, the term of this patent is extended or adjusted under 35 U.S.C. 154(b) by 19 days.

(21) Appl. No.: 10/244,641

(22) Filed: Sep. 16, 2002

(65) Prior Publication Data

US 2003/0048140 A1 Mar. 13, 2003

Related U.S. Application Data

(63) Continuation of application No. PCT/DE01/00871, filed on Mar. 7, 2001.

(30) Foreign Application Priority Data

Mar. 16, 2000 (DE) .......................................... 100 12 872

(51) Int. Cl.$^7$ ................................................ H03K 3/18
(52) U.S. Cl. ........................................ 334/15; 257/601
(58) Field of Search ........................... 334/15; 257/595, 257/601, 602

(56) References Cited

U.S. PATENT DOCUMENTS 4,023,053 A    5/1977   Shimizu et al. ........... 334/15 X
4,584,544 A    4/1986   Hettiger ....................... 333/174
6,084,486 A *  7/2000   Suzuki et al. ................ 333/174
6,125,269 A *  9/2000   Brekelmans ............. 455/180.1

FOREIGN PATENT DOCUMENTS

| DE | 36 06 437 C2 | 8/1986 |
| GB | 1182864 | 3/1970 |
| JP | 60 060 746 | 4/1985 |
| JP | 04 186 678 | 7/1992 |
| JP | 07 183 767 | 7/1995 |
| JP | 08 264 713 | 10/1996 |

* cited by examiner

Primary Examiner—Benny Lee
(74) Attorney, Agent, or Firm—Laurence A. Greenberg; Werner H. Stemer; Gregory L. Mayback

(57) ABSTRACT

An electronic component has at least a first diode and a second diode that are capacitance diodes. The characteristic curve of the second diode has a fixed, known relationship to that of the first diode. For example, the first diode and the second diode can have an identical variation ratio, being the quotient of the maximum and minimum adjustable capacitances. These components are suitable for use in television tuners, for example in three-band tuners, where diodes having the same characteristic curve and coming from different components are arranged and connected in each sub-receiving unit. The integration of a plurality of diodes reduces the number of components required, and also the time and cost involved in grouping together diodes with good synchronization properties.

12 Claims, 4 Drawing Sheets

ELECTRONIC COMPONENT CONTAINING CAPACITANCE DIODES, HAVING DIFFERENT CAPACITANCE RANGES, AND CIRCUIT CONFIGURATION CONTAINING THE COMPONENT

CROSS-REFERENCE TO RELATED APPLICATION

This application is a continuation of copending International Application No. PCT/DE01/00871, filed Mar. 7, 2001, which designated the United States and which was not published in English.

BACKGROUND OF THE INVENTION

Field of the Invention

The invention pertains to an electronic component, for example a three-band television tuner, having a plurality of capacitance diodes. The invention further pertains to the utilization of such a component in a receiving unit, and to a circuit configuration that contains one or more of these components.

In order to receive a given one of different television programs, the receiver is tuned to the frequency at which the given program concerned is broadcast.

The frequencies used for transmission purposes, for example in television technology, are divided into ranges referred to as frequency bands. Usually receivers can be tuned to one frequency band or several frequency bands. This has the advantage that one receiving unit need not be designed for all frequencies to be received, but sub-receiving units can be provided, each covering just one frequency band. The tuning circuits in the sub-receiving units are then optimized to the relatively small frequency spectrum of the respective band. See, for example, U.S. Pat. No. 4,584,544 and corresponding German patent DE 36 06 437 C2.

The frequencies used for television transmission are subdivided into three bands. The low VHF band in the United States, as assigned by the FCC, covers the frequency spectrum from 54 to 88 Megahertz (45–126 MHz in Europe), the high VHF band covers the frequencies 174 to 216 Megahertz (133–407 MHz in Europe), and the UHF band covers the frequency interval from 470 to 890 Megahertz (415–860 MHz in Europe). Electrically independent sub-receiving units, usually containing a mixer and an oscillator, are normally used for the VHF and the UHF range. Each sub-receiving unit contains a number of resonant circuits tuned to the receive frequency or the oscillator frequency. Capacitance diodes are arranged in the resonant circuits as tuning elements.

Receiving units (tuners) normally have two or three sub-receiving units. In "three-band tuners", one sub-receiving unit is provided for each band. In addition, there are tuners that only contain two sub-receiving units, one of the two sub-receiving units being designed such that the resonant circuits contained in the sub-receiving unit can be switched between two frequency bands. Inductances are provided for this purpose in each resonant circuit, one of the inductances can be short-circuited by means of switching diodes in order to switch bands. These tuners are called two-band tuners.

The resonant circuits in the tuning range of a sub-receiving unit must be synchronized in order to guarantee a constant transmission characteristic and a constant output frequency of the tuner. Thus high demands are placed on the synchronism of the tuning diodes, which are normally capacitance diodes having adjustable capacitance.

Two options are known for obtaining diodes with good synchronization properties: in a first known technique, the characteristic of all fabricated diodes is measured, i.e. six different electrical voltages are applied, for example, and the measurable capacitance recorded for each applied voltage. Diodes that differ only slightly amongst themselves are grouped together into sets. In a second known technique, those diodes that are immediately adjacent on the wafer in fabrication are grouped into sets. This is called sliding synchronism. The described prior art techniques share the common disadvantage of involving a large effort and expense, electrically and logistically.

Since the capacitance diodes, functioning as tuning diodes, of the various sub-receiving units are designed for different frequency bands, the diodes have different capacitance ranges. While the capacitance diodes to be used for the lower frequency band of a three-band tuner have a relatively large capacitance, the diodes required for the upper frequency band have a relatively small capacitance. The capacitance ranges, that is the characteristic curves, of the capacitance diodes can be influenced by varying the dimensions of the diodes and the technology.

Tuners, especially those suitable for television sets, are subject to competitive pricing pressures. The pricing pressure are countered by a higher degree of integration of the components, or a reduction in the number of components. Integrating a set of diodes together to be used in a single sub-receiving unit is not possible, however, because the coupling that then exists between the diodes means that the resonant circuits in a sub-receiving unit would be coupled together. The associated loss in selectivity makes this alternative seem impracticable.

SUMMARY OF THE INVENTION

It is accordingly an object of the invention to provide an electronic component with capacitance diodes, as well as the utilization of the component in a receiver and a circuit configuration with the component, which overcomes the above-mentioned disadvantages of the heretofore-known devices and methods of this general type and which provides for an electronic component having a plurality of capacitance diodes, that is suitable for meeting the requirements for synchronism of capacitance diodes in television tuners while also contributing to a reduction in cost.

With the foregoing and other objects in view there is provided, in accordance with the invention, an electronic component, comprising a first diode and a second diode disposed in a common package, each of the diodes having a capacitance that is adjustable, by a control voltage, over a capacitance range between a minimum capacitance and a maximum capacitance, and each of the diodes having a capacitance characteristic curve depending on the control voltage, the characteristic curve of the second diode having a fixed, known relationship to the characteristic curve of the first diode.

With regard to the utilization of the novel concept, the objects are achieved by using of one or more components as described above in a receiving unit that has a first and a second sub-receiving unit. The first diodes are used as tuning diodes in the first receiving unit, and the second diodes are used as tuning diodes in the second receiving unit.

Particularly good synchronization properties, especially among the first diodes and among the second diodes, result when the chips used for the components and containing the diodes are immediately adjacent on the wafer during fabrication prior to being sawn into individual components.

With regard to the circuit configuration, the object is achieved using a tuner circuit containing one or more components as described above, having a first sub-tuner in which the first diodes of the components are arranged, and a second sub-tuner in which the second diodes of the components are arranged.

The described component has at least two diodes, the capacitance of each of the diodes being adjustable by means of a control voltage. The minimum adjustable capacitance and the maximum adjustable capacitance set a lower and upper limit respectively to the capacitance range of the diodes. A characteristic curve describes the dependence of the capacitance on the control voltage, where the characteristic curve of the second diode has a fixed, known relationship to that of the first diode. One of ordinary skill in the art can make reliable conclusions about the characteristic curve of the second diode by measuring the characteristic curve of the first diode.

The integration of a plurality of diodes in one component offers a cost saving because a reduction in the necessary chip area is possible, and also the number of required components can be reduced in applications in which these components are used. The production costs of such applications, for example as receiver units, fall.

In those applications where very high demands are placed on the synchronism of the capacitance diodes used, the described principle also leads to a reduction in cost, because only one diode in each component now needs to be checked. This is because if the electrical properties of one diode of a component are measured, then the electrical properties of the other diodes arranged on the same component are also known. This is because the diodes of a component are subject to the same production conditions, environmental conditions and the tolerances associated with the production and environmental conditions. If one then compares the electrical properties, for example the capacitance range, characterized particularly by the minimum and maximum adjustable capacitance, of a number of first diodes of various components, for example by measurement, and if these first diodes are synchronized, then all the second and/or other diodes of the various components are also synchronized. This leads to a reduction in the time spent on testing and thus to a reduction in cost.

The grouping of more than one diode on one component also leads to a higher yield.

The characteristic curve of the second diode has a fixed, known relationship to that of the first diode. Thus, the measurement of the characteristic curve of the first diode, i.e. the capacitance of the diode as a function of the applied control voltage, which can be found by making measurements at a number of points, for example, enables conclusions to be drawn about the actual characteristic curve of the second diode.

In accordance with an advantageous feature of the invention, the first and second diodes of a component have an identical variation ratio. The variation ratio of a capacitance diode is defined as the quotient of the maximum and minimum adjustable capacitances. This variation ratio is directly proportional to the area of a capacitance diode. If, for example, the second diode has twice the area of the first diode, then this results in four times the capacitance. Such components are particularly suited to use in receiving units containing a plurality of sub-receiving units using different frequency bands. For higher frequencies, capacitance diodes with a lower capacitance and smaller capacitance range are required.

The ratio of maximum adjustable capacitance to minimum adjustable capacitance can be called the slope. If first and second diodes have passed through the same implantation and doping production steps in a fabrication procedure, then the slope of their characteristic curves is identical. This also applies if the area of a first diode is a multiple of the area of a second diode by means of dimensional scaling. If first and second diodes have passed through different production steps using mask control, then the slope of their characteristic curves is different.

In accordance with an added feature of the invention, the first and second diodes are integrated monolithically in one component.

In accordance with another advantageous embodiment of the present invention, adjacent diodes on a component have opposite polarity in order to reduce coupling between the diodes.

Connecting the cathodes of the diodes of a component to high-value resistors enables a further reduction in space and cost, because in this case only one resistor is now required for the reverse-voltage supply to the component.

In some applications for the described component, additional coupling diodes are required. Such a coupling diode can be integrated in the described component.

In two-band tuners, switching diodes are required for switching a sub-receiving unit between two frequency bands. These switching diodes can be integrated in the component.

The immediately adjacent arrangement of a plurality of capacitance diodes on one wafer in the fabrication of the component prior to being sawn leads to a particularly high pairing of the diodes of the components. This results in each of the first diodes of the components having very good synchronization properties, and the same applies to the second diodes of the components. This is particularly advantageous for applications in which high demands are placed on the synchronization properties of diodes of a component set. This applies, for example, to receiving units in television sets that may contain more than one sub-receiving unit.

Other features which are considered as characteristic for the invention are set forth in the appended claims.

Although the invention is illustrated and described herein as embodied in a electronic component containing capacitance diodes, use of the component in a receiving unit, and circuit configuration containing the component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
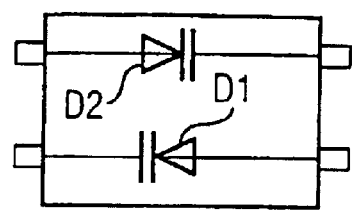
FIG. 1 is a schematic view of a first embodiment of the present invention containing a first and a second capacitance diode.

Referring now to the figures of the drawing in detail and first, particularly, to FIG. 1 thereof, there is shown a first exemplary embodiment of a component containing a first capacitance diode D1 and a second capacitance diode D2. The two diodes are integrated in one component. The characteristic curve of the second diode D2 has a fixed, known relationship to the capacitance range of the first diode D1. For example, by a simple scaling of the diodes, the capacitance range of the second compared with the first diode can be different. This is because, if the second diode has a smaller area than the first diode, its capacitance is also smaller. A reduction in the capacitance by a factor of 4 means that the capacitance range of the second diode can vary from ¼ pF to 5 pF for a capacitance range for the first diode of 1 pF to 20 pF. The variation ratio, which equals the quotient of the maximum and minimum adjustable capacitances, remains the same for this simple dimensional scaling of the diodes, where only the diode area is changed. In the numerical example, the variation ratio for the first and the second diode equals 20 in each case.

If the variation in the capacitance range of the diodes is not sufficient by simple dimensional scaling, i.e. by enlarging or reducing the diode area of the second diode D2 with respect to the diode area of the first diode D1, then suitable implantation by doping of the semiconductor material using mask control is possible during fabrication of the component. By this means it is possible, for example, for the capacitance range of the second diode to extend from 1 pF to 30 pF, while that of the first diode extends from 1 pF to 20 pF. The first and second diodes of the component as shown in FIG. 1 have opposite polarity in order to obtain minimum coupling between the diodes.

Figure 2:
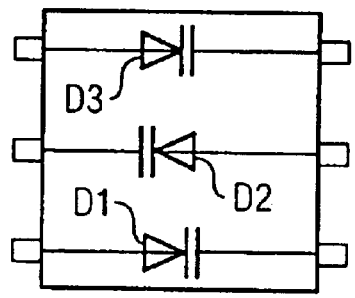
FIG. 2 is a schematic view of a component as shown in FIG. 1 containing a third capacitance diode.

The component shown in FIG. 2, like the component in FIG. 1, contains a first and a second capacitance diode D1, D2, but in addition a third capacitance diode D3 is provided. By means of dimensional scaling, the third diode D3 can also have a different frequency range compared with the first two diodes D1, D2. Such a component containing three capacitance diodes, each with a different capacitance range, is suitable for use in three-band tuners, for example, since capacitance diodes matched to the frequencies are required in order to tune the resonant circuits of the different frequency bands. The higher the frequency of the frequency band concerned, the smaller the capacitance and the capacitance range of the tuning diode to be used.

Figure 3:
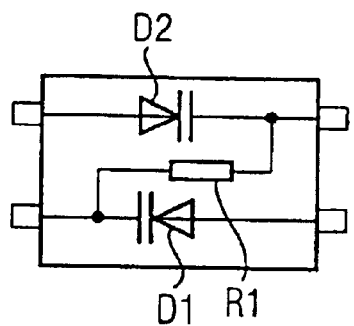
FIG. 3 is a schematic view of a component as shown in FIG. 1 having cathodes of the diodes connected together by a high resistance.

FIG. 3 shows a component having a first capacitance diode D1 and a second capacitance diode D2 as shown in FIG. 1, the cathode contacts of the two diodes being connected by a high-value resistor with R1 equal to 20 kΩ. By integrating a resistor R1 in the component, only one resistor is now required to connect the component to an external reverse-voltage supply.

Figure 4:
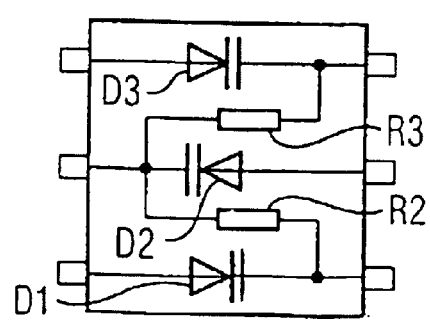
FIG. 4 is a schematic view of a component as shown in FIG. 2 having cathodes of the diodes connected to one another by a high resistance.

FIG. 4 shows a component containing a first and a second diode D1, D2 and a third diode D3, all of which can have different capacitance ranges, the cathode contacts of the first diode D1 and of the second diode D2 being connected to one another by a high-value resistor R2, and the cathode contacts of the second diode D2 and the third diode D3 also being connected to one another by a high-value resistor R3. Thus, again only one external resistor is required to connect the component shown in FIG. 4 to a reverse-voltage supply.

Figure 5:
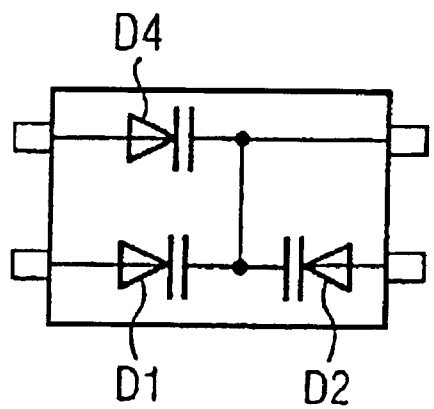
FIG. 5 is a schematic view of a component as shown in FIG. 1 containing a coupling diode.
Figure 6:
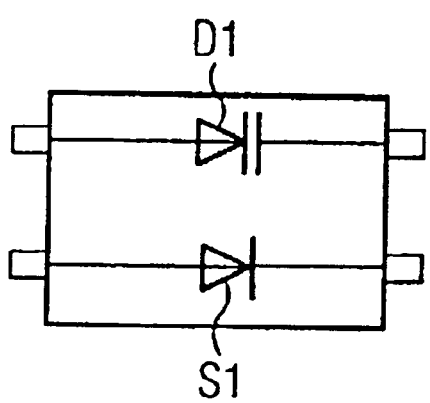
FIG. 6 is a schematic view of a component containing a capacitance diode and a switching diode.

In addition to the first diode D1 and the second diode D2, the component shown in FIG. 5 has an additional coupling diode D4. This may be advantageous in those tuners that require coupling diodes. The component shown in FIG. 6 has a first diode D1 and additionally a switching diode S1.

Figure 7:
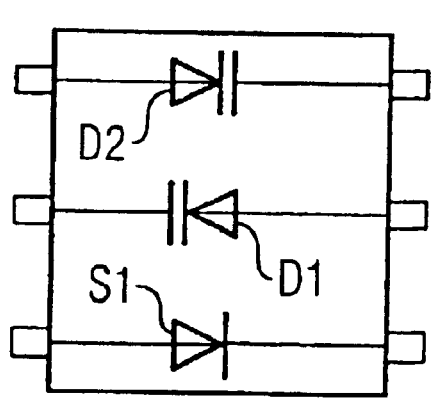
FIG. 7 is a schematic view of a component containing a first and a second capacitance diode and containing a switching diode.

The component shown in FIG. 7 has a first capacitance diode D1 and a second capacitance diode D2 as shown in FIG. 1, and additionally a switching diode S1. Such a component is particularly suitable for use in two-band tuners, because in television-technology receiving units consisting of two sub-receiving units, one of the two sub-receiving units must be designed to allow switching between two frequency bands. For this purpose, a switching diode S1 should be assigned to each tuning diode or capacitance diode in a sub-receiving unit.

Figure 8:
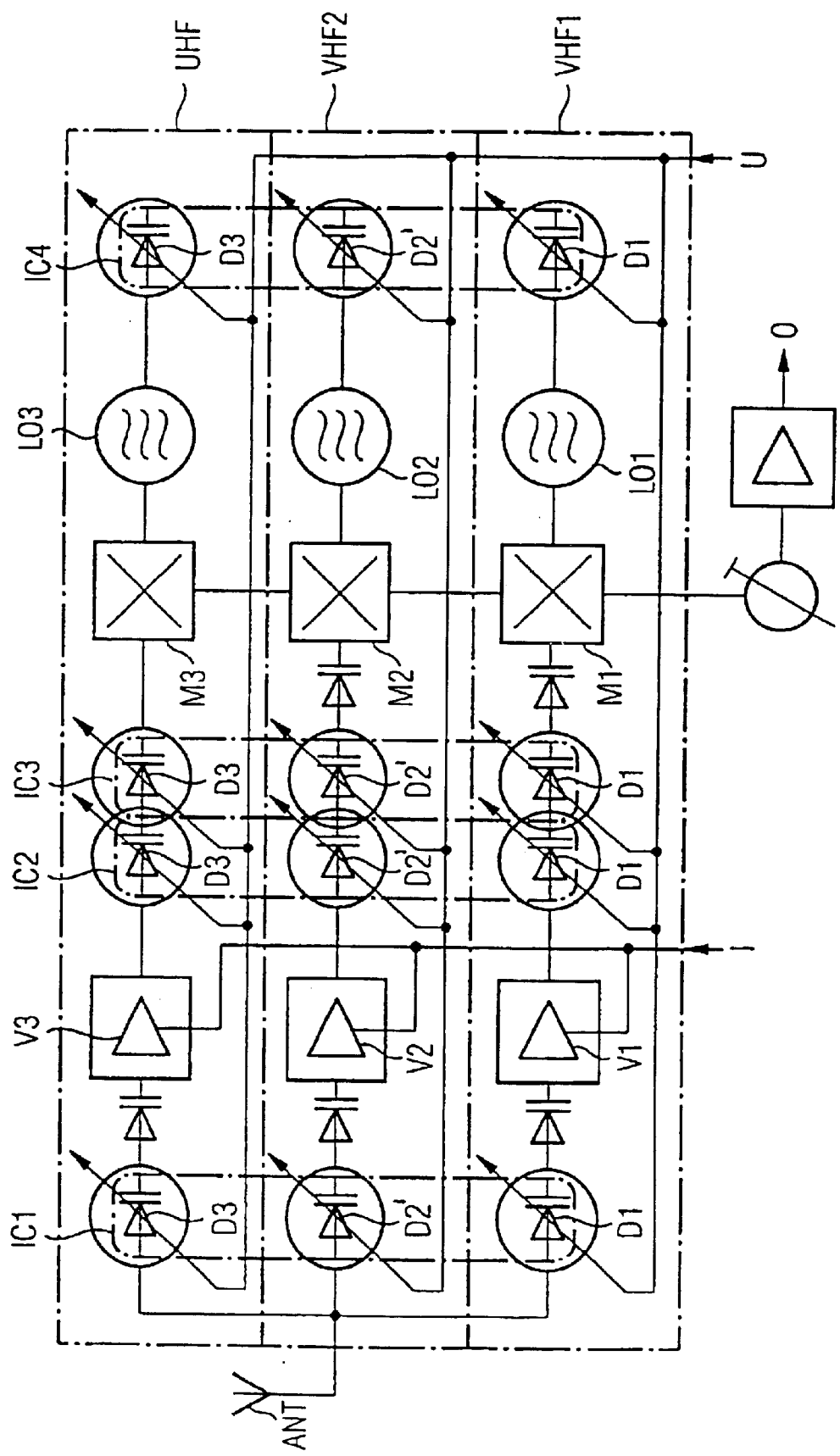
FIG. 8 is a schematic diagram of an application example having four components as shown in FIG. 2 in a 3-band tuner.

FIG. 8 shows an exemplary embodiment of a three-band television tuner having three sub-receiving units, where the sub-receiving unit VHF1 shown below is designed for the band with frequencies 54–88 MHz in the United States (45–126 MHz in Euro e), the center sub-receiving unit VHF2 covers the frequency spectrum 174–216 MHz in the United States (133–407 MHz in Europe), and the third sub-receiving unit UHF is suitable for receiving in the frequency range 470–890 MHz in the United States (415–860 MHz in Europe). Each receiver unit has a mixer M1, M2, M3 in which the receive signal, which, for example, can be fed to an antenna input ANT, is mixed with a signal generated locally in a respective oscillator LO1, LO2, LO3. Each sub-receiving unit VHF1, VHF2, UHF contains a set of synchronized capacitance diodes. Horizontal integration of the four tuning diodes belonging to a sub-receiving unit is ruled out, because the individual diodes, and thus the resonant circuits, would be coupled together. This would lead to a loss of selectivity. It is possible, however, to integrate the tuning diodes in a vertical direction. Thus, three diodes D1, D2', D3 are grouped together, or that is to say integrated, in a common package in each case. The number of tuning-diode components can be reduced in the exemplary embodiment from 12 to 4. Now only four components IC1, IC2, IC3, IC4 are required, each of which has three tuning diodes D1, D2', D3, each of which must be designed to suit the different frequency levels concerned. The first diodes D1 of the sub-receiving unit having the lowest frequency VHF1 have a relatively large capacitance. The third diodes D3 of the highest frequency band UHF have a relatively small capacitance. The capacitance of the second diodes D2' of the center frequency band VHF2 lies between the two. The capacitance of the capacitance diodes D1, D2', D3 can be adjusted using a voltage U. It is possible, for example, to modify the respective capacitance range of the diodes D1, D2', D3 to suit the respective frequency band using dimensional scaling as already explained. In addition to the saving in cost and time by the reduction in components, this scaling allows a simplified design of the PLL (phase locked loop) synthesizer. It results in an improved noise performance for the oscillators LO1, LO2, LO3. Each of the sub-receiving units VHF1, VHF2, UHF contains an amplifier V1, V2, V3 to which a control signal I can be applied. The amplified output signal O can be taken out from the outputs of the mixers M1, M2, M3.

The diode sets, which have diodes that are each synchronized, can now be grouped together more simply, because it is sufficient to measure and to compare the electrical properties, for instance the characteristic curve or the capacitance range, of all the first or all the second or all the third diodes respectively. The ratio of the capacitance range of the other diodes of the components to the compared diodes is known, thus these diodes are then also synchronized.

If, during fabrication of the components that contain a plurality of monolithically integrated capacitance diodes, the later components are arranged immediately adjacent on the wafer, then particularly good synchronization properties can be achieved among the first, second and third diodes respectively.

Figure 9:
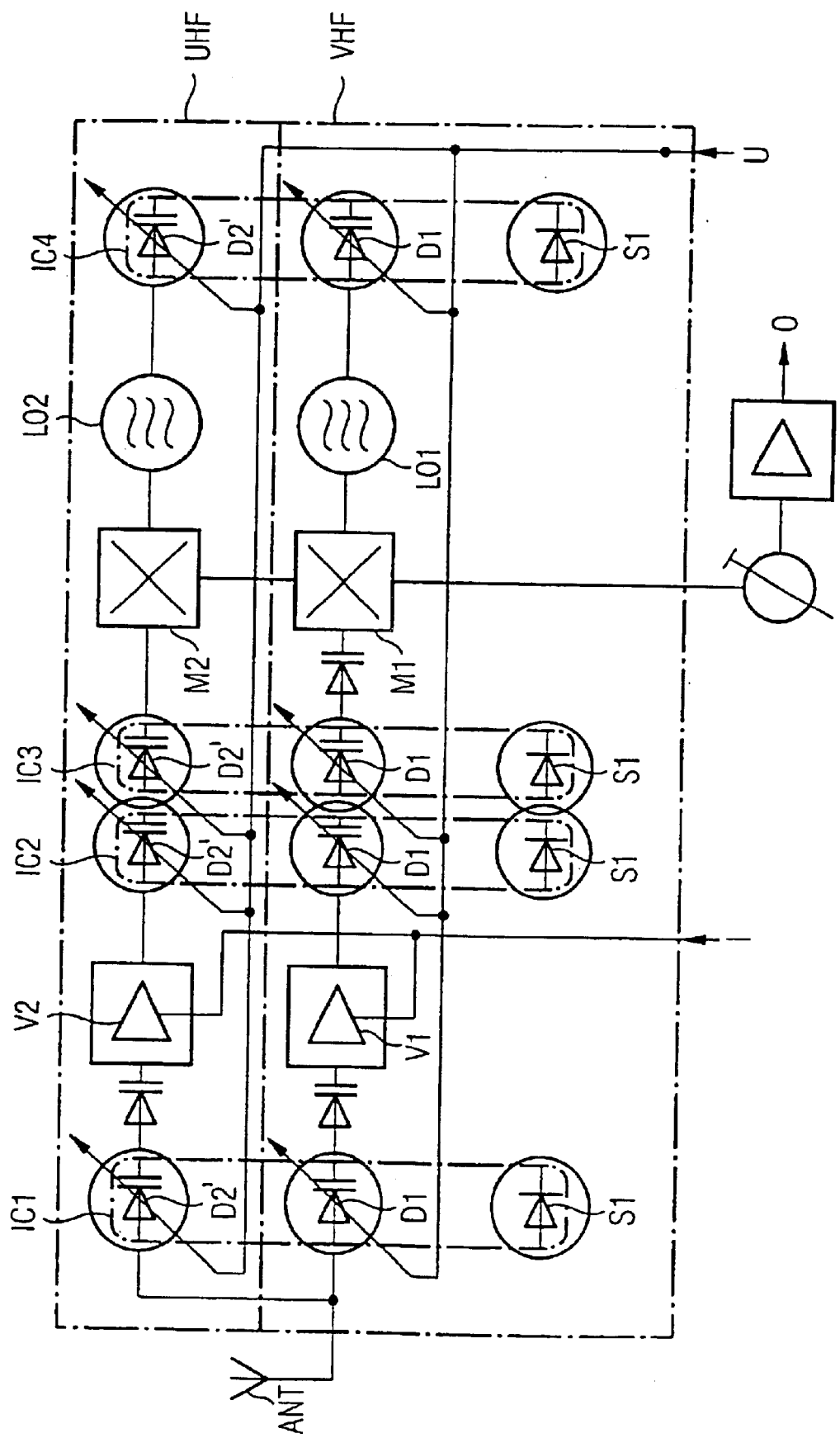
FIG. 9 is a schematic diagram of an application example having four components as shown in FIG. 7 in a 2-band tuner.

FIG. 9 shows a two-band (UHF/VHF) tuner for television sets, the lower sub-receiving unit VHF being designed such that it can be switched between two frequency bands. Switching diodes S1 are provided for this purpose, which are used to short-circuit non-illustrated inductances and thus enable switching between two frequency bands. The information given in the description of FIG. 8 applies by analogy to the first and second diodes D1, D2'. Here, a first diode D1, a second diode D2' and a switching diode S1 are arranged on one component IC1, IC2, IC3, IC4 in each case. Note that in the FIG. 9 description, like reference labels already described in FIG. 8 will not be further described herein.

I claim:

1. An electronic component, comprising a first diode and a second diode disposed in a common package, each of said diodes having a respective capacitance adjustable, through a corresponding control voltage, over a corresponding capacitance range between a minimum capacitance and a maximum capacitance, and each of said diodes having a respective capacitance characteristic curve depending on the corresponding control voltage, sail characteristic curve of said second diode having a fixed, known relationship to said characteristic curve of said first diode, and said first diode and said second diode have mutually different adjustable capacitance ranges.

2. The electronic component according to claim 1, wherein each diode has a respective variation ratio, defined as a quotient of the corresponding maximum capacitance and the corresponding minimum capacitance, and said variation ratio of said first diode is identical to said variation ratio of said second diode.

3. The electronic component according to claim 1, wherein said first diode and said second diode are monolithically integrated in the component.

4. A tuner circuit, comprising:

a plurality of components each according to claim 1;

a first sub-tuner encompassing said first diodes of said plurality of components; and a second sub-tuner encompassing said second diodes of said plurality of components.

5. The electronic component according to claim 1, wherein said first and second diodes are adjacent diodes having opposite polarity.

6. The electronic component according to claim 1, wherein said first and second diodes have respective cathode contacts, and a resistor is connected between said cathode contacts of said first and second diodes.

7. The electronic component according to claim 1, wherein said first and second diodes have respective cathode contacts, and a coupling diode has a cathode contact connected to said cathode contacts of said first diode and of said second diode.

8. The electronic component according to claim 1, which further comprises a switching diode.

9. The electronic component according to claim 1, wherein said first and second diodes comprise contacts passed out of the common package.

10. In combination with a receiving unit having a first and a second sub-receiving unit, an electronic component according to claim 1, wherein said first diode is a tuning diode in the first sub-receiving unit, and said second diode is a tuning diode in the second sub-receiving unit.

11. In combination with a receiving unit, having a first and a second sub-receiving unit, a plurality of electronic components each according to claim 1, wherein said first diodes are tuning diodes in the first sub-receiving unit, and said second diodes are tuning diodes in the second sub-receiving unit.

12. A tuner circuit, comprising: at least one component according to claim 1;

a first sub-tuner encompassing said first diode of said component; and a second sub-tuner encompassing said second diode of said component.

* * * * *

UNITED STATES PATENT AND TRADEMARK OFFICE
CERTIFICATE OF CORRECTION

PATENT NO. : 6,842,094 B2
DATED : January 11, 2005
INVENTOR(S) : Henning Hohmann It is certified that error appears in the above-identified patent and that said Letters Patent is hereby corrected as shown below:

Column 7,
Line 40, should read as follows:
-- corresponding control voltage, said characteristic curve of --.

Signed and Sealed this

Tenth Day of May, 2005

JON W. DUDAS
*Director of the United States Patent and Trademark Office*